(12) United States Patent
Randazzo

(10) Patent No.: US 6,587,322 B2
(45) Date of Patent: Jul. 1, 2003

(54) SWAPPED DRAIN STRUCTURES FOR ELECTROSTATIC DISCHARGE PROTECTION

(75) Inventor: Todd A. Randazzo, Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/026,186

(22) Filed: Dec. 20, 2001

(65) Prior Publication Data

US 2002/0055219 A1 May 9, 2002

Related U.S. Application Data

(62) Division of application No. 09/388,727, filed on Sep. 2, 1999, now Pat. No. 6,359,314.

(51) Int. Cl.[7] ................................................. H02H 9/00
(52) U.S. Cl. ........................ 361/56; 361/58; 361/91.1; 361/111
(58) Field of Search .............................. 361/56, 58, 111, 361/91.1, 117

(56) References Cited

U.S. PATENT DOCUMENTS

| | | | |
|---|---|---|---|
| 5,159,518 A | 10/1992 | Roy | 361/56 |
| 5,301,084 A | 4/1994 | Miller | 361/91 |
| 5,578,872 A | 11/1996 | Chen et al. | 257/751 |
| 5,585,299 A | 12/1996 | Hsu | 437/56 |
| 5,615,073 A | 3/1997 | Fried et al. | 361/56 |
| 5,654,860 A | 8/1997 | Casper et al. | 361/91 |
| 5,663,082 A | 9/1997 | Lee | 438/234 |
| 5,729,419 A | 3/1998 | Lien | 361/111 |
| 5,754,380 A | 5/1998 | Ker et al. | 361/56 |
| 5,897,348 A | 4/1999 | Wu | 438/200 |
| 5,990,723 A | 11/1999 | Tanase | 327/313 |
| 6,133,077 A | 10/2000 | Randazzo | 438/199 |
| 6,236,086 B1 | 5/2001 | Cheng | 257/355 |
| 6,359,314 B1 * | 3/2002 | Randazzo | 257/355 |

* cited by examiner

Primary Examiner—Stephen W. Jackson
(74) Attorney, Agent, or Firm—Carsten, Yee & Cahoon, L.L.P.

(57) ABSTRACT

A method and apparatus for manufacturing an electrostatic discharge protection device. A first gate structure for the electrostatic device is formed. A first lightly doped drain and a second lightly doped drain for the electrostatic discharge protection device is formed. A second gate structure for a data path transistor is formed. A third lightly doped drain and a fourth lightly doped drain for a data path transistor is formed, wherein the first lightly doped drain and the second lightly doped drain have a higher doping level relative to the third lightly doped drain and the fourth lightly doped drain.

23 Claims, 7 Drawing Sheets

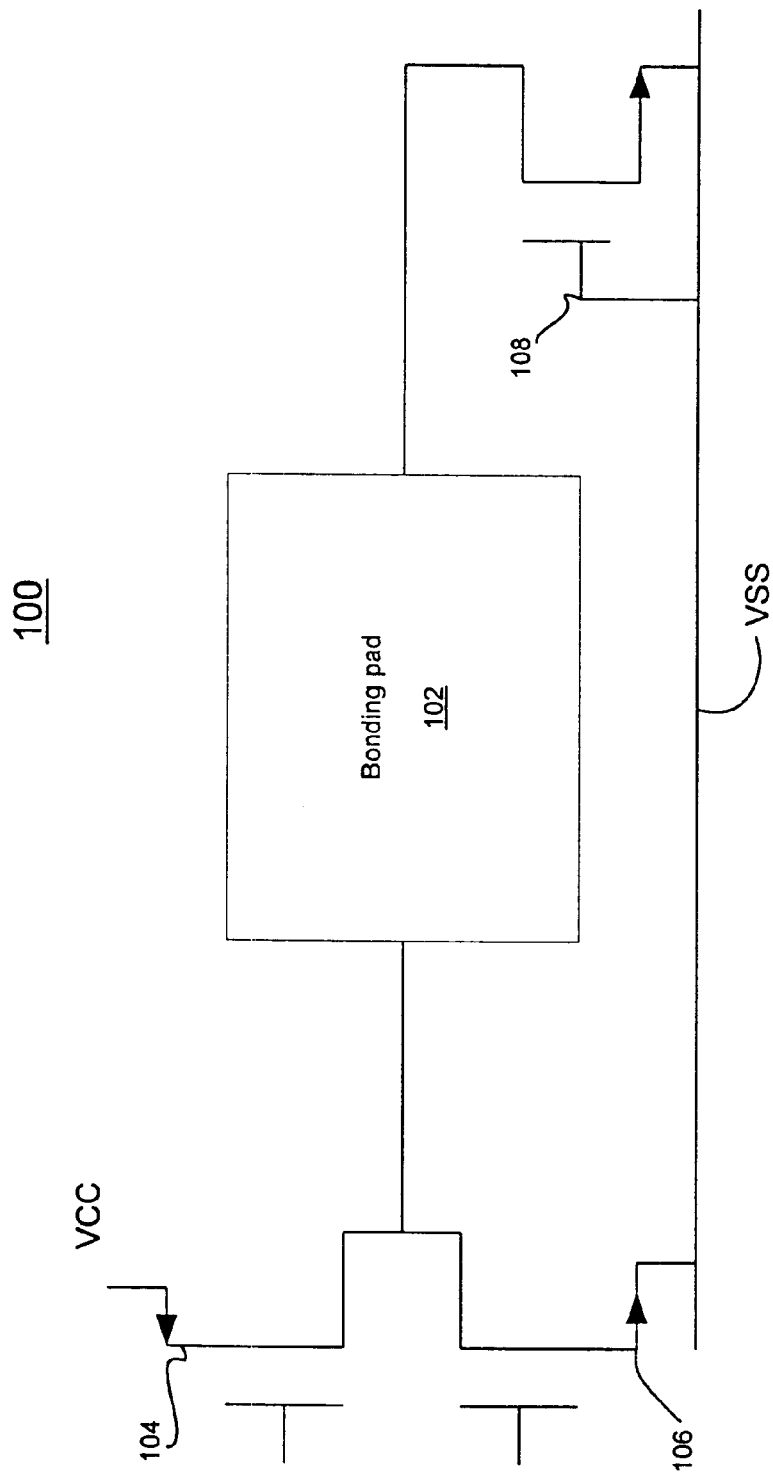

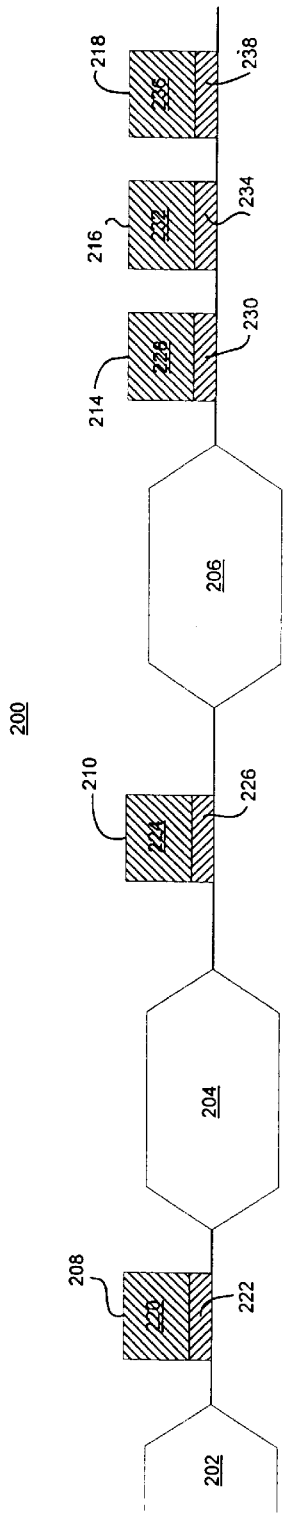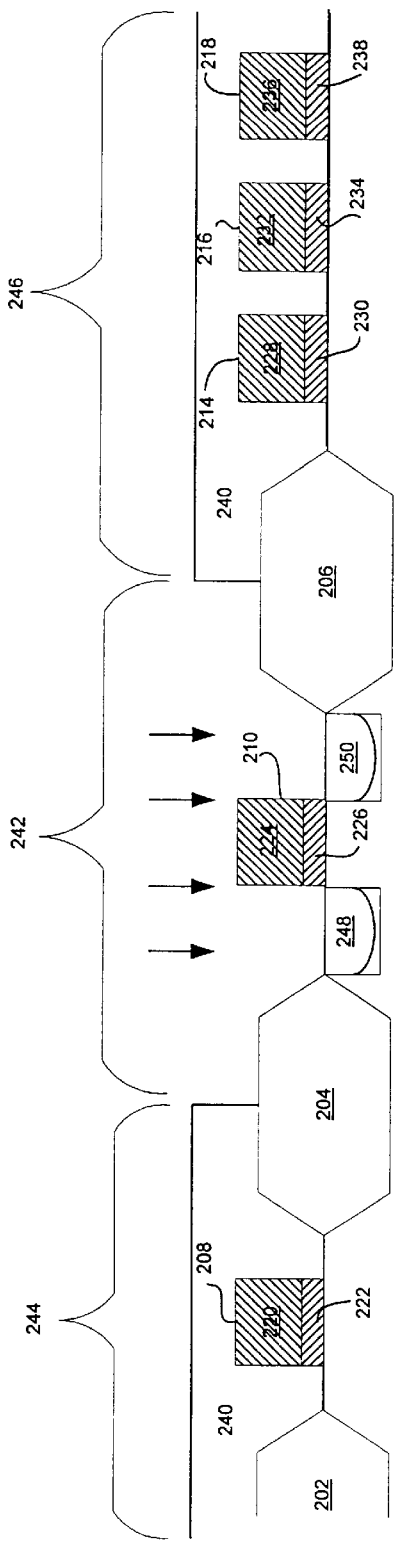

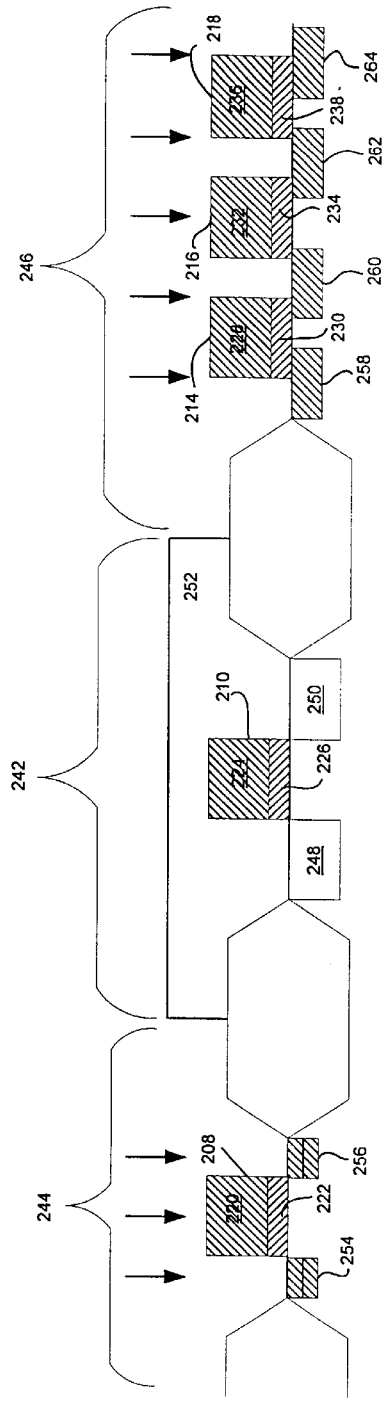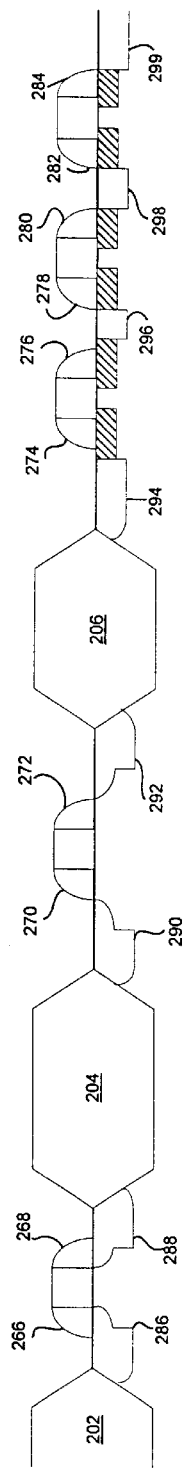

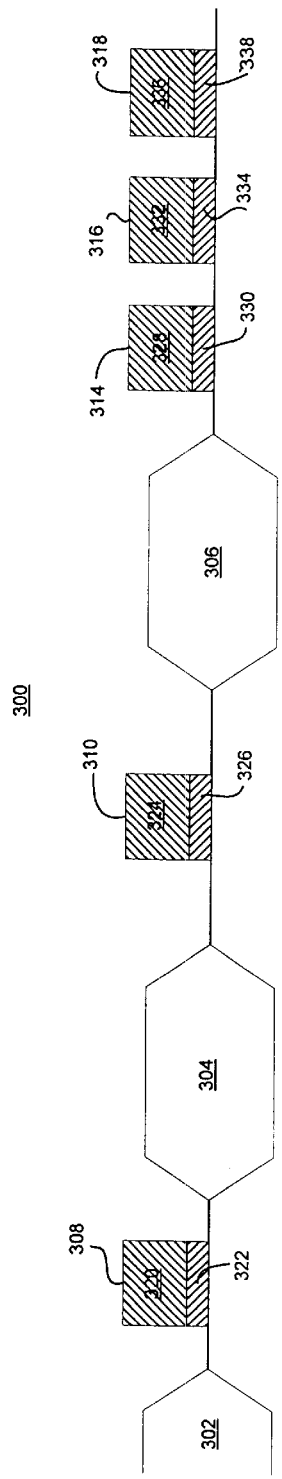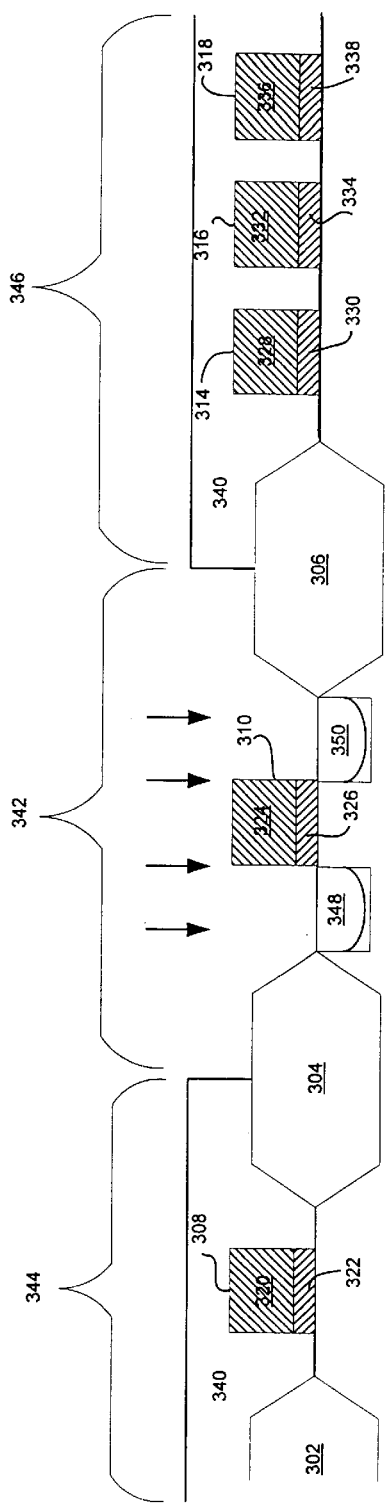

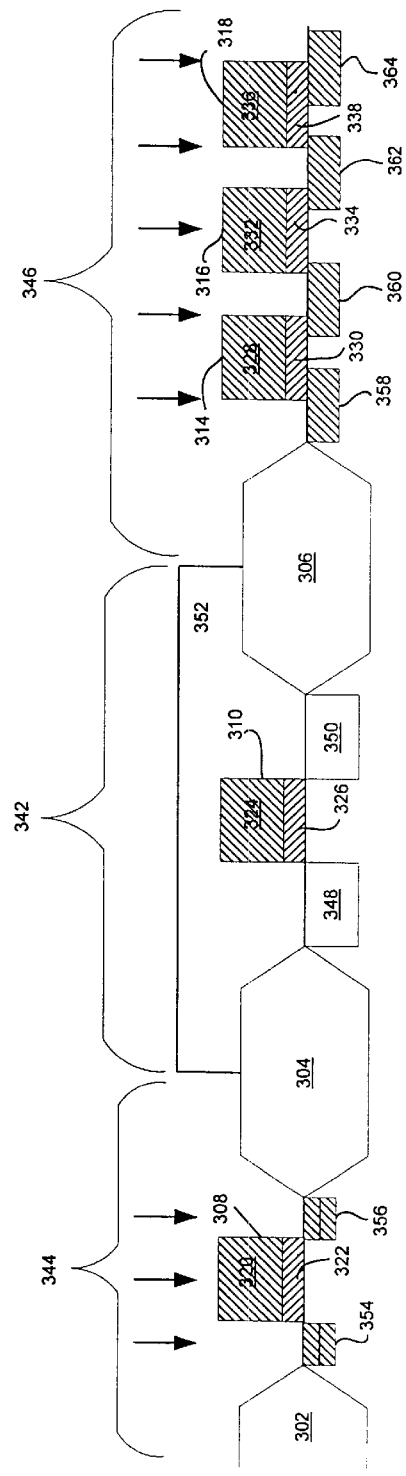
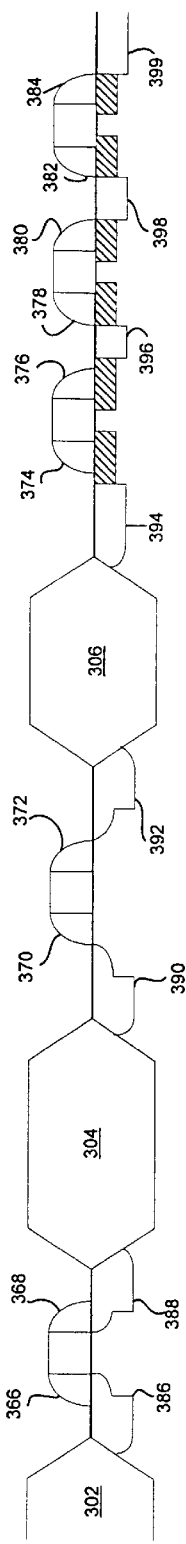
Figure 3C
Figure 3D

Figure 5

| | TOX ESD Dummy Device | TOX Datapath Device | Normal Masks Open | | | Proposed Masks Open | | |
|---|---|---|---|---|---|---|---|---|
| | | | ESD | Datapath | | ESD | | Datapath |
| Low Voltage I/O | 50Å | 50Å | LOWV NLDD | LOWV NLDD | | LOWV NLDD | | HIGHV NLDD Swapped |
| High Voltage I/O | 70Å | 70Å | HIGHV NLDD | HIGHV NLDD | | LOWV NLDD Swapped | | HIGHV NLDD |

500

SWAPPED DRAIN STRUCTURES FOR ELECTROSTATIC DISCHARGE PROTECTION

This application is a divisional of application Ser. No. 09/388,727, filed Sep. 2, 1999, now U.S. Pat. No. 6,359,314, status allowed.

BACKGROUND OF THE INVENTION

1. Technical Field

The present invention relates generally to semiconductor integrated circuit processing, and in particular to electrostatic discharge protection for semiconductor device. Still more particularly, the present invention relates to a method and apparatus for providing electrostatic discharge protection in complimentary metal oxide semiconductor integrated circuits.

2. Description of the Related Art

An electrostatic discharge is basically more or less a sudden violent redistribution of electrons between bodies, such that in their new special equilibrium position, the electrons end up as far away from each other as they could possibly get. The charges always position themselves outside the skin of a conductive body because of the repulsion between the charges.

Whenever movement occurs, a static charge may be produced. Electrostatic discharge (ESD) is caused by the rapid flow of charge between two objects. Voltages as low as 200 volts can damage the vices. Typically, a person feels ESD at greater than 3,000 volts. ESD may cause gate oxide breakdown, junction spiking, and latch-up in various integrated circuit devices.

It has been shown that voltage potentials up to 28 kV can be generated and discharged in less than 10 nanosecond through an IC device when handled by a person. Electrostatic charge can also be accumulated on pin of the lead frame of a packaged IC device during shipping, storage or while being integrated into an electronic system which is discharged when another pin is grounded. The discharge of the high electrostatic voltage can result in a current of about two amperes. The high current must flow through the IC device when another pin or pad is grounded. MOS devices are particularly susceptible to discharge of the electrostatic charge because the thin gate oxide can be easily ruptured by the voltage induced by the high current.

ESD events can and do happen to semiconductor devices during normal handling or operating procedures associated with transportation, manufacturing, and testing. A device, which suffers from damage, may fail to operate correctly.

CMOS integrated circuit devices are vulnerable to electrostatic discharge (ESD) induced failure. ESD events or spikes are typically short-duration, high-voltage electrical pulses that are caused, for example, by discharge of a static charge. ESD causes failure of a MOS integrated circuit device by overheating components due to overcurrent, breakdown of thin oxide, or other conditions. ESD can damage or destroy integrated circuit devices unless measures are taken to reduce ESD effects on the input pins and output pins of the devices. Various techniques have been used to self-protect output buffers or other input-output nodes against ESD failures. Some of these measures include diode clamps, lateral punch-through devices, and guard ring collectors around and input-output bonding pad. These circuits are reasonably effective for protecting input circuits, but are less effective for protecting output circuits from high transient voltages.

These internal ESD structures are employed typically to bypass over-voltage events to either a power supply voltage, such as VCC, or a lower power supply voltage, such as VSS, or ground. Metal oxide semiconductor (MOS) and complimentary metal oxide semiconductor (CMOS) devices within gate oxides are particularly susceptible to ESD events.

All integrated circuit (IC) devices are sensitive to ESD to some degree. However, as IC devices are made smaller, ESD damage is more likely to occur and render the device inoperable in response to an ESD event. Particularly susceptible are MOS and CMOS devices with thin gate oxides.

The need for ESD protection in IC devices that can handle the high current produced by an ESD event has been recognized for many years. However, it is typical that ESD protection circuits are designed to provide protection against electrostatic charge levels of between 500 volts to 3.0 kilovolts because once the IC device has been inserted into a system, the need for ESD protection is minimized since most such systems generally incorporate sophisticated ESD protection. However, prior to insertion, IC devices are particularly vulnerable to ESD pulses applied to the IC device's pins or pads.

As CMOS integrated circuits are scaled to thinner oxides, the input/output (I/O) circuitry is becoming more sensitive to ESD. Salicided source/drain defusions tend to further aggravate this ESD sensitivity as output transistors have less series resistance to limit the current through any given cross section of the device.

As the output data path transistors, transistors actually involved in chip-to-chip data transmission, become more and more ESD sensitive, it is increasingly common to deploy a dummy device of some sort to discharge ESD pulse. The intent is to alleviate all ESD-driven constraints on the output transistor by having a separate element disperse the charge in the ESD pulse.

One problem with this approach is finding an ESD protection element, which will always trigger before the data path transistor. Numerous elements have been employed including metal oxide semiconductor field effect transistors (MOSFETs), silicon controlled rectifiers (SCRs), zener diodes, and bipolar devices. In almost every case, additional process steps are required to ensure that the protection device has a lower breakdown or trigger voltage compared with the data path transistor. The additional process steps increase the time and increase the complexity of manufacturing integrated circuits.

Therefore, it would be advantageous to have an improved method for manufacturing an ESD protection element that does not require additional process steps to set a lower breakdown voltage compared to that of a data path transistor.

SUMMARY OF THE INVENTION

The present invention provides a method and apparatus for manufacturing an electrostatic discharge protection device. A first gate structure and a second gate structure are formed for the electrostatic device and a data path transistor. A first lightly doped drain and a second lightly doped drain is formed for the electrostatic discharge protection device. A third lightly doped drain and a fourth lightly doped drain is formed for a data path transistor, wherein the first lightly doped drain and the second lightly doped drain have a higher doping level relative to the third lightly doped drain and the fourth lightly doped drain.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a diagram of an electrostatic discharge (ESD) protection circuit in accordance with a preferred embodiment of the present invention;

FIGS. 2A–2D are cross-sections illustrating a process for manufacturing an electrostatic protection device used with high voltage devices in accordance with a preferred embodiment of the present invention;

FIGS. 3A–3D are cross-sections illustrating the process used in creating a electrostatic device used with a low voltage data path transistor in accordance with a preferred embodiment of the present invention;

FIG. 5 is a table illustrating the changes in masks used to process ESD and data path transistors in accordance with a preferred embodiment of the present invention.

DETAILED DESCRIPTION

Figure 4:
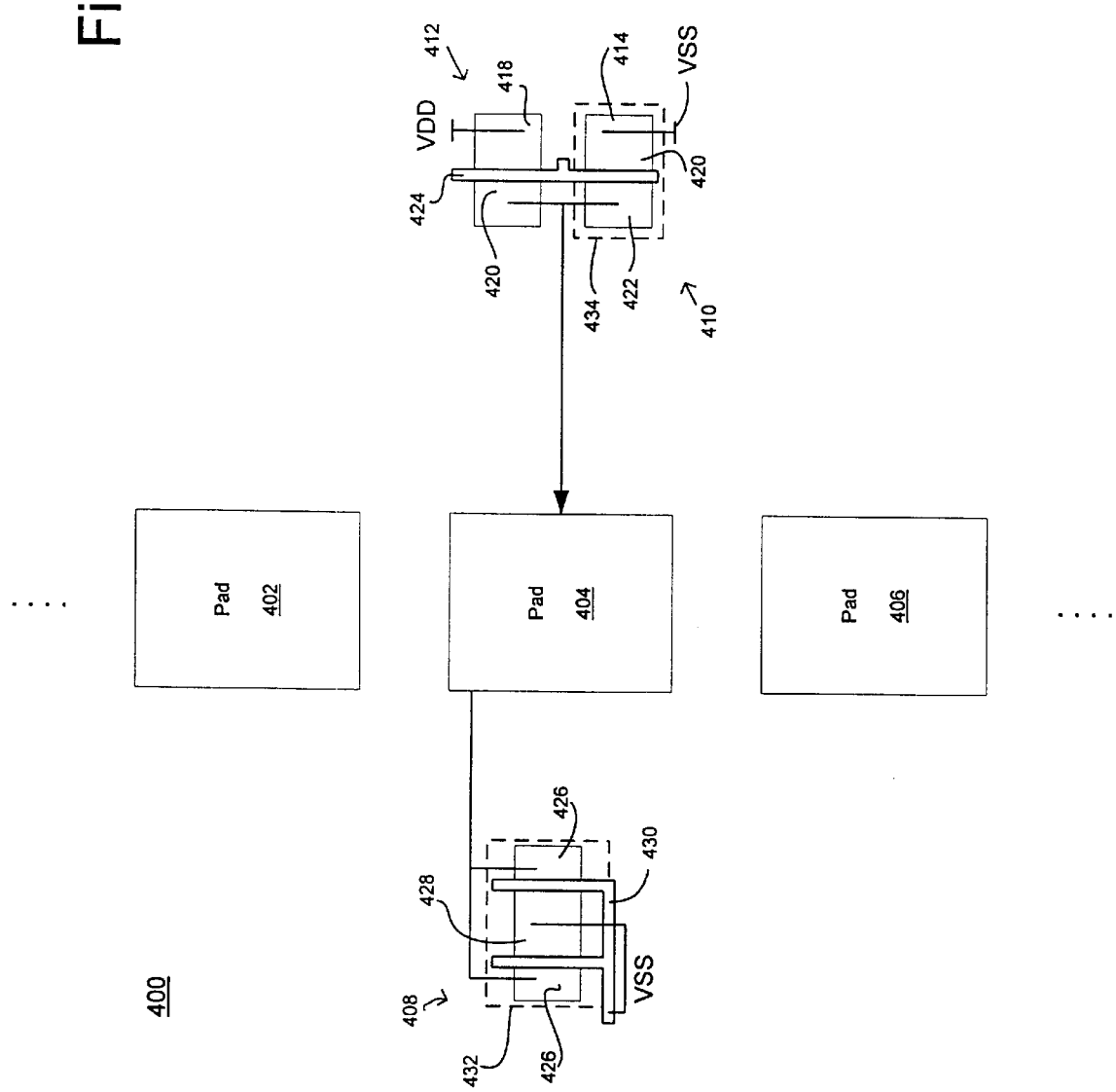
FIG. 4 is a planer view of an electrostatic discharge protection system for use in I/O buffers in accordance with a preferred embodiment of the present invention.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

With reference now to FIG. 1, a diagram of an electrostatic discharge (ESD) protection circuit is depicted in accordance with a preferred embodiment of the present invention. Circuit 100 is part of a data path between chips for data transmission. Bonding pad 102 is an output pad in the depicted example and is connected to transistors 104 and 106. Transistor 104 is a p-channel metal oxide semiconductor (MOS) transistor while transistor 106 is an n-channel metal oxide semiconductor (NMOS) transistor. In this example, the source of transistor 104 is connected to an upper power supply voltage, VCC, with the source of transistor 106 being connected to a lower power supply voltage, VSS. The drain of transistors 104 and 106 are connected to each other and bonding pad 102. Data is transmitted to bonding pad 102 via signals controlled by the gates of transistors 104 and 106. Transistor 108 is an ESD device employed to disperse the charge in the ESD pulse. In accordance with a preferred embodiment of the present invention, this element, transistor 108, is designed to always trigger before a data path transistor. Transistors 104 and 106 are data path transistors. Transistor 108 is a NMOS transistor having a drain tied to bonding pad 102 and its source connected to lower power supply voltage, VSS. In addition, the gate of transistor 108 also is connected to lower power supply voltage, VSS.

The present invention provides an improved ESD protection device that may be created without adding additional process steps to ensure that the protect device has a lower breakdown voltage compared with the data path transistor. In particular, the present invention provides this advantage by adjusting the mask artwork to "swap" lightly doped drains (LDDs) and to create two additional device types. In one case, a low voltage device with a thin oxide is created with a relatively low LDD dose. In another case, a high voltage device is created with a thick oxide, but a relatively high LDD dose. Whether one of the two additional devices is used as a protect transistor, such as to prove ESD protection or as a data path transistor, depends on whether the data path transistor is a high voltage element or a low voltage element. In the depicted example, a high voltage element is a transistor operating at 3.3-volts or more while low voltage elements operating at 2.5-volts or less.

In the situation in which data path transistor 106 is a high voltage element, transistor 108, the protect device is adjusted to a non-standard device. The mask artwork used to create transistors is modified such that transistor 108 has a thick gate oxide. In other words, the gate oxide of transistor 108 is thicker relative to transistors for core logic devices. Core logic devices are devices located within the integrated circuit that are not part of the I/O buffers. In addition, transistor 108 will have a high LDD doping, which would normally go into a low voltage transistor. Further, other common techniques may be employed in conjunction to help transistor 108 trigger first with respect to triggering of transistors 104 and 106. These techniques may include remote p-well ties, gate-to-drain coupling, resistance in series with the gate, modified gate length, and salicide-block such that transistor 108 triggers non-destructively. Transistor 106 is fabricated as a standard high voltage data path transistor. In other words, transistor 106 will have a thick gate oxide and reduced LDD doping. This doping is reduced relative to the transistors in the core logic devices of the integrated circuit.

In the case where the data path transistor, such as transistor 106, is a low voltage element, the data path transistor is adjusted to a non-standard device in accordance with a preferred embodiment of the present invention. In such a situation, the mask artwork for transistor 106 is modified to have a thin gate oxide, but with a LDD, which would normally go into a high voltage transistor. In this case, transistor 106 is a low voltage data path transistor. Such a change will effect the electrical properties by ten percent or more, requiring new models. With a low voltage system, transistor 108 is a low voltage protect device that is kept standard. For example, transistor 108 will have a thin gate oxide and a higher doped n type LDD (NLDD). In these examples, the LDD implants are NLDD implants. In addition, other common techniques may be employed to help transistor 108 trigger prior to the data path transistor, transistor 106. For example, removing p-well ties, gate-to-drain coupling, resistance in series with the gate, and salicide block may be used so that transistor 108 triggers non-destructively.

In this manner with swapped LDDs, a highly effective protect device may be created, which will trigger before the data path devices. This advantage is provided by adjustment of mask artwork to swap LDDs between low voltage and high voltage devices to create effective ESD protection devices.

With reference now to FIGS. 2A–2D, cross-sections illustrating a process for manufacturing an electrostatic protection device used with high voltage devices is depicted in accordance with a preferred embodiment of the present invention. In this example, a high voltage device is considered a device operating at 3.3 volts or greater. In FIG. 2A, substrate 200 is a silicon substrate. Depending on the implementation, substrate 200 also may be made of other materials or combinations of materials, such as a silicon on illustrator (SOI) substrate. Field oxide regions 202, 204, and 206 have been formed in an area of substrate 200 to separate active areas within substrate 200. These field oxide regions are formed through thermal oxidation in the depicted examples. Also shown in FIG. 2A are gate structures 208, 210, 214, 216, and 218. Gate structure 208 includes a polysilicon layer 220 over a gate oxide layer 222. Gate structure 208 is the gate structure for an ESD transistor device and is about 70 angstroms thick and is designed to operate at high voltages, such as 3.3 volts. Similarly, gate structure 210 is a gate structure for a data path transistor, such as transistor 106 in FIG. 1. Gate structure 210 includes a polysilicon layer 224 and a gate oxide layer 226, which are about 70 angstroms thick. Gate structures 214, 216, and 218 have polysilicon layers 228, 232, 236, and gate oxide layers 230, 234, and 238, respectively. These gate structures are about 50 angstroms thick and form gate structures for transistors for high performance core logic devices. These devices are designed to operate at 2.5 volts in the depicted example. As mentioned before, core logic devices are devices other than those used in the I/O buffers.

A photoresist layer 240 in FIG. 2B is deposited on substrate 200 and patterned and etched to form an opening in section 242. In the depicted example, the device in section 242 is a NMOS transistor, such as transistor 108 in FIG. 1. Photoresist layer 240 has a thickness of about 7000 angstroms. Photoresist layer 240 may range in thickness from about 5000 angstroms to about 11000 angstroms. Thereafter, an n-type LDD (NLDD) implant is performed. In this example, the LDD implant is made using a dose having concentration of about 1E13 $cm^{-3}$ to about 1E14 $cm^{-3}$ for a high voltage LDD. The implant energy for this implant is typically from about 25 keV to about 75 keV. The dopant typically used is either phosphorus or arsenic for this step.

Normally, section 244 would also receive the implant because it is a 70 angstrom, 3.3 volt device. The doses and implant energies described in these examples are those for low voltage devices having a voltage of 2.5 volts and for high voltage devices operating at 3.3 volts. If other voltages are used, different doses and implant energies may be used depending on the actual voltages and depending on the line widths. In accordance with a preferred embodiment of the present invention, section 244 remains part of a low voltage LDD covered with photoresist layer 240 to prevent high voltage LDD doping from occurring in section 244. The device in section 244 is a NMOS data path transistor, such as transistor 106 in FIG. 1. In this example, the core logic devices also are blocked from receiving this high voltage LDD implant. This doping is illustrated in FIG. 2B. High performance core logic devices are found in section 246 in FIG. 2B. The LDD implant of an N type does not form NLDD regions 248 and 250.

Thereafter, a LDD implant is made for the core logic devices, which are low voltage high performance devices in this example. This LDD implant is accomplished by depositing photoresist layer 252 in FIG. 2C prior to implantation.

The photoresist layer shown in FIG. 2C has been patterned and etched to leave photoresist layer 252 in section 242 while sections 244 and 246 remain exposed for the LDD implant. The photoresist thicknesses for this process are similar to those for the used and the high voltage LDD implant. Thereafter, a LDD implant is performed to form LDD regions 254, 256, 258, 260, 262, and 264. The concentration of the implant for a low voltage LDD implant is from about 6E13 $cm^{-3}$ to about 4E13 $cm^{-3}$ using an energy from about 10 keV to about 50 keV. In this example, the dopant used would be arsenic. Further, a implant, also referred to as a "halo" or "pocket" implant may be performed. This type of implant involves implanting the opposite type of species into the device. For example, boron or a $BF_2$ implant may be made at moderate doses, such as about 1E12 $cm^{-3}$ to about 5E12 $cm^{-3}$. The dose may be at a higher energy than that of the low voltage LDD implant or the implant may be at a tilt angle. This type of implant further shallows the LDD by cutting off the bottom of the junction.

Normally, the device in section 244 would not receive this LDD implant because it is a 70 angstrom, 3.3 volt device as opposed to the core logic devices, which are 50 angstrom, 2.5 volt devices. In accordance with a preferred embodiment of the present invention, however, the device in section 244 receives this reduced LDD doping. In this manner, the ESD protection device formed in section 242 will trigger prior to the data path device in section 244.

Thereafter, oxide spacers 266–284 are formed for the various devices along with source/drain implants to form source/drains 286–299 as shown in FIG. 2D. As a result, the device in section 244 is a 70 angstrom, 3.3 volt device with a NLDD for a 2.5 volt device.

With reference now to FIGS. 3A–3D, cross-sections illustrating the process used in creating a electrostatic device used with a low voltage data path transistor is depicted in accordance with a preferred embodiment of the present invention. In FIG. 3A, substrate 300 is a silicon substrate. Depending on the implementation, substrate 300 also may be made of other materials or combinations of materials, such as a silicon on illustrator (SOI) substrate. Field oxide regions 302, 304, and 306 have been formed in an area of substrate 300 to separate active areas within substrate 300. These field oxide regions are formed through thermal oxidation in the depicted examples. Also shown in FIG. 3A are gate structures 308, 310, 314, 316, and 318. Gate structure 308 includes a polysilicon layer 320 over a gate oxide layer 322. Gate structure 308 is the gate structure for an ESD transistor device and is about 50 angstroms thick and is designed to operate at high voltages, such as 2.5 volts. Similarly, gate structure 310 is a gate structure for a data path transistor, such as transistor 106 in FIG. 1. Gate structure 310 includes a polysilicon layer 324 and a gate oxide layer 326, which are about 50 angstroms thick. Gate structure 314, 316, and 318 have polysilicon layers 328, 332, 336, and gate oxide layers 330, 334, and 338, respectively. These gate structures are about 50 angstroms thick and form gate structures for transistors for high performance core logic devices. These devices are designed to operate at 2.5 volts in the depicted example. As mentioned before, core logic devices are devices other than those used in the I/O buffers.

A photoresist layer 340 in FIG. 3B is deposited on substrate 300 and patterned and etched to form an opening in section 342. In the depicted example, the device in section 342 is a NMOS transistor, such as transistor 108 in FIG. 1. Photoresist layer 340 has a thickness of about 7000 angstroms. Photoresist layer 340 may range in thickness from about 5000 angstroms to about 5000 angstroms. Thereafter, a high voltage LDD implant is performed. Thereafter, an n-type LDD (NLDD) implant is performed. In this example, the LDD implant is made using a dose having concentration of about 1E13 $cm^{-3}$ to about 1E14 $cm^{-3}$ for a high voltage LDD. The implant energy for this implant is typically from about 25 keV to about 75 keV. The dopant typically used is either phosphorus or arsenic for this step.

The device in section 342 normally would not receive this LDD implant because it is a low voltage I/O device. Section 342 receives the implant to raise the snap back voltage.

When a drain of an n-channel transistor breaks down, the voltage collapses to a low value. This effect is called a "snap back". The drain voltage required to trigger the n-channel transistor is the snap back voltage and the voltage that the transistor drops down to or holds at is the snap back hold voltage.

In accordance with a preferred embodiment of the present invention, sections 344 and 346 remain covered with photoresist layer 340. The device in section 344 is a NMOS data path transistor, such as transistor 106 in FIG. 1. High performance core logic devices are found in section 346 in FIG. 3B.

A low voltage high performance LDD doping is performed for sections 344 and 346 in FIG. 3C. The LDD implant using N type dopants forms NLDD regions 348 and 350. The concentration of the implant for a low voltage LDD implant is from about 6E13 $cm^{-3}$ to about 4E13 $cm^{-3}$ using an energy from about 10 keV to about 50 keV. In this example, the dopant used would be arsenic. Further, a implant, also referred to as a "halo" or "pocket" implant may be performed. This type of implant involves implanting the opposite type of species into the device. For example, boron or a $BF_2$ implant may be made at moderate doses, such as about 1E12 $cm^{-3}$ to about 5E12 $cm^{-3}$. The dose may be at a higher energy than that of the low voltage LDD implant or the implant may be at a tilt angle. This type of implant further shallows the LDD by cutting off the bottom of the junction. Thereafter, an LDD implant is made for the core logic devices, which are low voltage high performance devices in this example. This LDD implant is accomplished by depositing photoresist layer 352 in FIG. 3C.

The photoresist layer shown in FIG. 3C has been patterned and etched to leave photoresist layer 352 in section 342 while sections 344 and 346 remain exposed for the LDD implant, which is a low voltage high performance LDD implant. Thereafter, an LDD implant is performed to form LDD regions 354, 356, 358, 360, 362, and 364. In accordance with a preferred embodiment of the present invention, however, the device in section 342 does not receive this reduced LDD doping. In this manner, the ESD protection device formed in section 342 will trigger prior to the data path device in section 344.

Thereafter, oxide spacers 366–384 are formed for the various devices along with source/drain implants to form source/drains 386–399 as shown in FIG. 3D. As a result, the data path device in section 342 is a 50 angstrom, 2.5 volt device.

With reference now to FIG. 4, a planer view of an electrostatic discharge protection system for use in I/O buffers is depicted in accordance with a preferred embodiment of the present invention. In FIG. 4, substrate 400 contains pads 402, 404, and 406. In this example, an electrostatic device 408 is connected to pad 404 along with inverter 410, which includes data path transistor 412 and 414. Data path transistor 412 is a PMOS transistor while data path transistor 414 is a NMOS transistor. Data path transistor 412 includes a source 418 and a drain 420. Source 418 is connected to upper power supply voltage VDD. Data path transistor 414 includes a source 420 and a drain 422 in which source 420 is connected to a lower power supply voltage VSS. Drain 420 of data path transistor 412 and drain 422 of data path transistor 414 are tied together to pad 404. Data path transistors 412 and 414 have a common gate 424, which is connected to an input.

ESD device 408 has a drain region 426, a source region 428, and a gate region 430. Source region 428 and gate region 430 are tied to lower power supply voltage VSS while drain region 426 is connected to pad 404. In the depicted example, changes to the mask artwork in creating these devices is made in order to swap the LDD implants to provide for triggering of the ESD device prior to the data path transistor without increasing the number of processing steps. When high voltage devices are used for data path transistors, the masks for LDD implants are altered for the area indicated by dotted line 432, such that the ESD device receives the LDD implant used with core logic devices rather than the normal LDD implant used with high voltage devices. In this manner, the ESD device receives the high LDD doping, which is normally used in a low voltage transistor, such as those found in core logic devices operating at 2.5 volts. This LDD doping is higher than the high voltage devices used in the data path transistors operating at 3.3 volts. In this manner, the ESD device will trigger prior to the data path transistor. With respect to using low voltage elements in the data path, the region indicated by dotted line 434 has alterations in the mask artwork such that data path transistor 414 receives the LDD doping normally used with high voltage devices. The ESD device and the core logic devices received the normal low voltage LDD dopings. In this manner, the snap back voltage is raised for the data path transistor.

With reference now to FIG. 5, a table illustrating the changes in masks used to process ESD and data path transistors is depicted in accordance with a preferred embodiment of the present invention. As can be seen in table 500, both the ESD device and the data path transistor both receive a low NLDD doping when low voltage devices are used in the data path transistors. In accordance with a preferred embodiment of the present invention, the masks are altered such that the data path transistor receives a high voltage NLDD doping while the ESD device still receives the low voltage NLDD doping. As a result, the ESD device receives a heavier implantation and triggers prior to the data path transistor. When high voltage devices are used in the data path transistors, the masks normally both result in the ESD device and the data path transistor having high voltage NLDD dopings. In accordance with a preferred embodiment of the present invention, the masks are altered such that the ESD device receives a low voltage NLDD doping while the data path transistor still receives a high voltage NLDD doping. As a result, the ESD transistor will trigger prior to the data path transistor.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A method for manufacturing a semiconductor device comprising:

forming a first gate structure for the electrostatic device;

forming a first lightly doped drain and a second lightly doped drain for the electrostatic discharge protection device; and forming a second gate structure for a data path transistor; and forming a third lightly doped drain and a fourth lightly doped drain for a data path transistor, wherein the first lightly doped drain and the second lightly doped drain have a higher doping level relative to the third lightly doped drain and the fourth lightly doped drain.

2. The method of claim 1, wherein the electrostatic discharge protection device is a transistor.

3. The method of claim 2, wherein the transistor is a n-channel metal oxide semiconductor transistor.

4. A method of manufacturing a semiconductor device comprising:

forming a gate structure for the electrostatic discharge protection device;

forming gate structures for a data path device and for core logic devices;

forming a first photoresist layer, wherein an opening in the photoresist layer is present over the datapath device and the photoresist layer is present over the data path device and the core logic devices;

performing a first lightly doped drain implant;

removing the first photoresist layer;

forming a second photoresist layer, wherein an opening in the photoresist layer is present over the electrostatic discharge protection device and over the core logic devices while the photoresist layer is present over the data path device; and performing a second lightly doped drain implant, wherein the electrostatic discharge protection device is triggered before the data path device in response to an electrostatic discharge event.

5. The method of claim 4, wherein the gate structure for the electrostatic discharge protection device is about 50 angstroms thick and the gate structures for the datapath device and the core logic devices are about 50 angstroms thick.

6. The method of claim 4, wherein the gate structure for the electrostatic discharge protection device is about 70 angstroms thick, the gate structure for the data path device is about 70 angstroms thick, and the gate structures for core logic devices are about 50 angstroms thick.

7. The method of claim 4, wherein the electrostatic protection device is a transistor.

8. The method of claim 7, wherein the data path device is a data path transistor.

9. The method of claim 7, wherein the transistor is a metal oxide semiconductor transistor.

10. The method of claim 9, wherein the metal oxide semiconductor transistor is a n-channel metal oxide semiconductor transistor.

11. The method of claim 8, wherein the data path transistor is a metal oxide semiconductor data path transistor.

12. The method of claim 4, wherein the data path device in an output data path device.

13. The method of claim 8, wherein the data path device and the electrostatic discharge protection device are connected to a pad in an integrated circuit.

14. The method of claim 4, wherein the first implant is a high voltage lightly doped drain implant and the second implant is a low voltage lightly doped drain implant.

15. The method of claim 4, wherein the second lightly doped drain implant is a heavier implant than the first light lightly doped drain implant.

16. A method of manufacturing an electrostatic discharge protection device in an integrated circuit, the method comprising:

forming a gate structure for the electrostatic discharge protection device;

forming a gate structure for a data path device in the integrated circuit;

forming gate structures for core logic devices in the integrated circuit;

performing a first lightly doped drain implant on the data path device; and performing a second lightly doped drain implant on the electrostatic protection device and on the core logic devices, wherein the electrostatic discharge protection device is triggered before the data path device in response to an electrostatic discharge event.

17. The method of claim 16, wherein the gate structure for the electrostatic discharge protection device and for the data path device have a thickness substantially equal to the gates for the core logic devices.

18. The method of claim 17, wherein the gate structure for the electrostatic discharge device is about 50 angstroms thick.

19. The method of claim 16, wherein the gate structure for the electrostatic discharge protection device and for the data pad device have a thickness greater than the gate structures for the core logic devices.

20. The method of claim 19, wherein the gate structure for the electrostatic discharge protection device and for the data pad device are about 70 angstroms while the gates structures for the core logic devices have a thickness of about 50 angstroms.

21. The method of claim 16, wherein the second lightly doped drain implant is heavier than the first lightly doped drain implant.

22. The method of claim 21, wherein the gate structure for the electrostatic discharge protection device and for the data pad device have a thickness substantially equal to the gates for the core logic devices.

23. The method of claim 21, wherein the gate structure for the electrostatic discharge protection device and for the data pad device have a thickness greater than the gate structures for the core logic devices.

* * * * *